United States Patent
Lo Hine Tong et al.

(10) Patent No.: US 9,154,105 B2
(45) Date of Patent: Oct. 6, 2015

(54) DUAL-BAND MICROSTRIP-TO-SLOTLINE TRANSITION CIRCUIT

(71) Applicant: THOMSON LICENSING, Issy de Moulineaux (FR)

(72) Inventors: Dominique Lo Hine Tong, Rennes (FR); Philippe Minard, Saint Medard sur Ille (FR); Jean-Luc Robert, Betton (FR)

(73) Assignee: Thomson Licensing, Issy les Moulineaux (FR)

( * ) Notice: Subject to any disclaimer, the term of this patent is extended or adjusted under 35 U.S.C. 154(b) by 0 days.

(21) Appl. No.: 14/103,946

(22) Filed: Dec. 12, 2013

(65) Prior Publication Data

US 2014/0159835 A1 Jun. 12, 2014

(30) Foreign Application Priority Data

Dec. 12, 2012 (FR) ...................... 12 61943

(51) Int. Cl.
*H01P 5/10* (2006.01)
*H03H 7/01* (2006.01)
(Continued)

(52) U.S. Cl.
CPC .......... *H03H 7/0153* (2013.01); *H01P 5/1007* (2013.01); *H01P 5/16* (2013.01); *H01P 5/20* (2013.01)

(58) Field of Classification Search
CPC ....... H03H 7/0153; H01P 5/1007; H01P 5/16; H01P 5/184; H01P 5/20
USPC ............. 333/26, 33, 125, 128, 134, 137, 204, 333/236, 238; 343/767, 770
See application file for complete search history.

(56) References Cited

U.S. PATENT DOCUMENTS

| 5,142,255 A | 8/1992 | Chang | |
| 8,294,628 B2 * | 10/2012 | Le Naour et al. | ............. 343/770 |

(Continued)

FOREIGN PATENT DOCUMENTS

| EP | 1494316 | 1/2005 |
| FR | 2857165 | 1/2005 |

(Continued)

OTHER PUBLICATIONS

Yo-Shen Lin et al: "Novel lumped-element coplanar waveguide-to-slotline transitions", 1999 IEEE MTT-S Int'l Anaheim, Jun. 13-19, 1999, p. 1427.

(Continued)

*Primary Examiner* — Patrick O'Neill
(74) *Attorney, Agent, or Firm* — Robert D. Shedd; Brian J. Cromarty (57) ABSTRACT

This invention relates to a microstrip to slotline transition circuit operating on two frequency bands, in which a first filtering circuit is connected between a first portion of microstrip line and a first input/output port, said first circuit and the portion of microstrip line being adapted to accept the frequencies from a first frequency band and reject the frequencies of a second frequency band, a second filtering circuit is connected between a second portion of microstrip line and a second input/output port, said second circuit and the portion of microstrip line being adapted to accept the frequencies from the second frequency band and reject the frequencies from the first frequency band, and the slotline is sized to provide an impedance that is substantially equal to the impedance of an open circuit at the coupling zone between the microstrip line and the slotline.

8 Claims, 5 Drawing Sheets

(51) Int. Cl.
*H01P 5/16* (2006.01)
*H01P 5/20* (2006.01)

(56) References Cited

U.S. PATENT DOCUMENTS

| 8,537,065 | B2 * | 9/2013 | Minard et al. | 343/770 |
|---|---|---|---|---|
| 2005/0285809 | A1 | 12/2005 | Louzir et al. | |
| 2006/0202777 | A1 | 9/2006 | Deckman | |
| 2006/0228184 | A1 | 10/2006 | Jung | |
| 2008/0030418 | A1 | 2/2008 | Brachat et al. | |
| 2009/0231226 | A1 | 9/2009 | Quan et al. | |

FOREIGN PATENT DOCUMENTS

| FR | 2873857 | 2/2006 |
|---|---|---|
| WO | WO2007028448 | 3/2007 |

OTHER PUBLICATIONS

P. Minart et al: "Cost/performance optimized IEEE802.11A/B/G front end with integrated antenna diversit", Antennas and Propagation, Nov. 6, 2006, pp. 1-6.

Seach Report dated Sep. 10, 2013.

Chang et al., "A Dual-Band Printed Dipole Slot Antenna for 2.4/5.2 GHz WLAN Applications," Proceedings of the 2011 IEEE Antennas and Propagation Society International Symposium and USNC/URSI National Radio Science Meeting, pp. 274-277, IEEE, Jul. 8, 2011.

IEEE Std. 802.11a, Standard for Information Technology Telecommunications and information exchange between systems—Local and metropolitan area networks—Specific requirements, Part 11: Wireless LAN Medium Access Control and Physical Layer in the 5 GHz Band, Sep. 16, 1999.

IEEE Std. 802.11b, Standard for Information Technology Telecommunications and information exchange between systems—Local and metropolitan area networks—Specific requirements, Part 11: Wireless Lan Medium Access Control and Physical Layer Specifications: Higher Speed Physical Layer Extension in the 2.4 GHz Band, Jun. 12, 2003.

IEEE Std. 802.11g, Standard for Information Technology Telecommunications and information exchange between systems—Local and metropolitan area networks—Specific requirements, Part 11: Wireless Lan Medium Access Control and Physical Layer Specifications: Amendment 4: Further Higher Data Rate Extension in the 2.4 GHz Band Jun. 27, 2003.

IEEE Std. 802.11n, Standard for Information Technology Telecommunications and information exchange between systems—Local and metropolitan area networks—Specific requirements Amendment 5: Enhancements for Higher Throughput, Oct. 29, 2009.

\* cited by examiner

Solution-A  Solution-B  Solution-C

DUAL-BAND MICROSTRIP-TO-SLOTLINE TRANSITION CIRCUIT

This application claims the benefit, under 35 U.S.C. §119 of French Patent Application 1261943, filed Dec. 12, 2012.

TECHNICAL FIELD OF THE INVENTION

This invention relates to a microstrip-to-slotline transition circuit operating on two different frequency bands. The invention finds its application in the field of wireless systems operating simultaneously on two frequency bands, such as systems that operate according to the IEEE-802.11a/b/g/n standard. According to this standard, a wireless system can operate on a frequency band of around 2.4 GHz and on a frequency band of around 5 GHz.

This invention therefore relates to a microstrip-to-slotline transition circuit operating on two frequency bands, which can be used, specifically, to feed slot antennas in wireless radio communication systems.

TECHNOLOGICAL BACKGROUND

Wireless communication systems integrated into a gateway or a decoder are increasingly multi-mode and multi-standard. They can function on at least two different frequency bands. This therefore allows them to more effectively use the spectrum of available frequencies and satisfy growing needs for capacity and robustness. To meet these needs, in wireless systems based on the IEEE-802.11a/b/g standard, the usual solution is to use two radio bands at the same time, the first operating on the 2.4 GHz band to transmit only data and the second operating on the 5 GHz band to transmit only video.

To allow both transmission channels to coexist in a single device, both frequency bands must be isolated by about 40 dB in the RF front-end circuitry, as is normally requested. The most common solutions for providing the required isolation are shown by solutions A, B, and C in FIG. 1.

Figure 1:
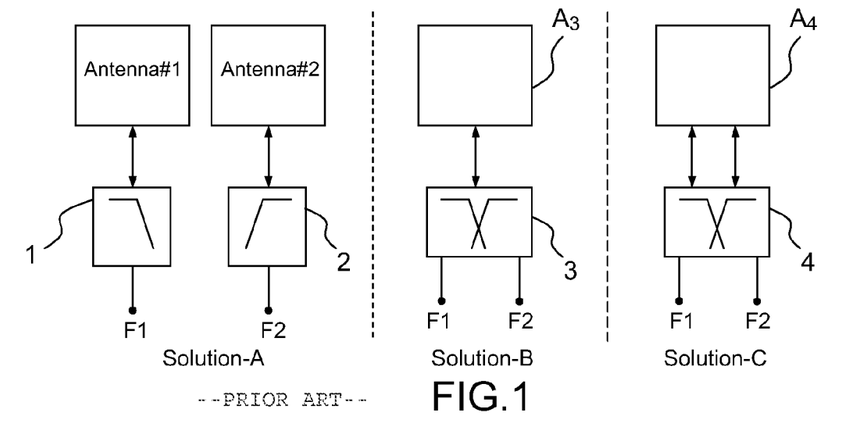
FIG. 1, already described, shows a block diagram of three possible solutions for an antenna architecture in a multi-standard multi-mode terminal.

Schematically, solution A consists of using two antennas, marked Antenna #1 and Antenna #2, radiating in a relatively narrow band. These antennas can be physically separated on the device's circuit board to allow maximum isolation. Each antenna is connected to a specific processing circuit on ports F1 and F2 and through a filter 1 or 2. Filters 1 and 2, which are respectively a low pass filter for filter 1 and a high pass filter for filter 2, in the shown embodiment, improve the isolation between the two antennas. The main disadvantage of this solution is its size, which is not acceptable for dual-band MIMO systems that require multiple antennas.

Solution B shows a broadband antenna, marked A3, which is connected by a single transmission line to a diplexer 3 used for separating the two bands and transmit them to the processing circuit by means of input/output ports F1 and F2. This solution is less cumbersome than solution A. However, the design of the broadband antenna is more difficult, and the 40 dB isolation is obtained by filters, which are more complex to achieve than the filters in solution A.

In solution C, a broadband antenna A4 is also used, but in this case, the antenna is connected by two access lines to the diplexer. At the two access terminals F1, F2, an isolation of about 15 to 20 dB can be obtained, which reduces the constraints on filtering.

Figure 2:
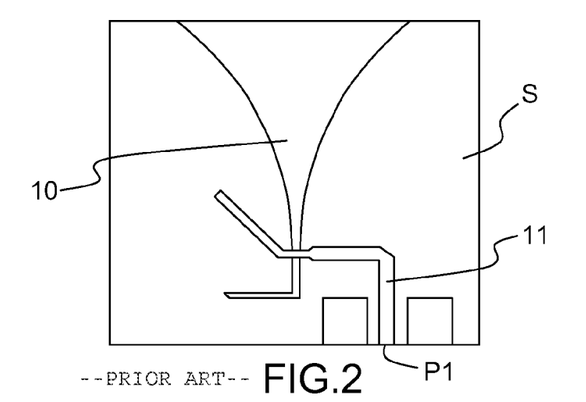
FIG. 2, already described, is a top view of a Vivaldi type broadband antenna fed by a microstrip-to-slotline transition according to the Knorr principle.
Figure 3:
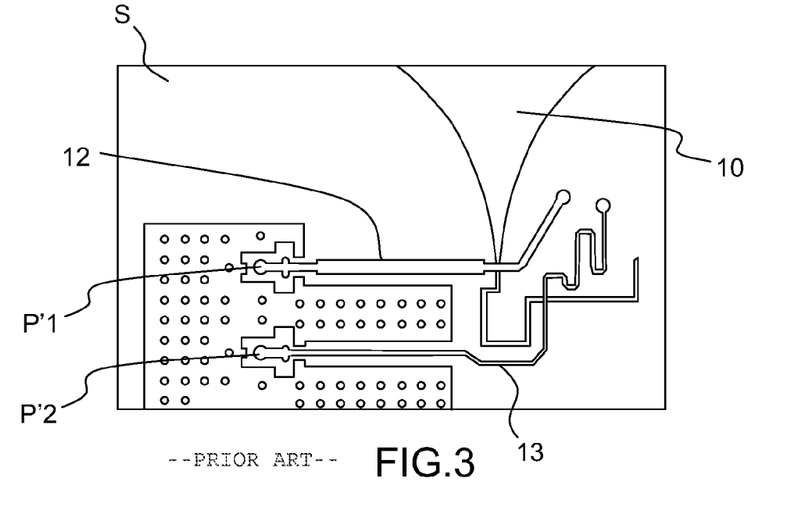
FIG. 3, already described, is a top view of a Vivaldi type slot antenna with two accesses, each using a microstrip-to-slotline transition according to the Knorr principle.

In a known manner, a broadband antenna can be realized by using a slot antenna, such as a TSA antenna (tapered slot antenna) or Vivaldi antenna. As shown in FIGS. 2 and 3, a Vivaldi antenna is realized on a substrate S equipped with a ground plane formed by a metal layer in which is etched a slot 10 whose ends open out toward the edges of the substrate. This slot 10 can be fed by a microstrip line 11 on the substrate at a predetermined distance from the ground plane. This microstrip line 11 extends from an input/output port P1 and crosses the slot 10 substantially perpendicular to said slot, as shown in FIG. 2. In this case, the Vivaldi antenna is fed by electromagnetic coupling along a microstrip/slotline transition circuit, known as a Knorr transition. To achieve the solution C described above, one can feed a Vivaldi type slot antenna 10 with two microstrip lines 12, 13 crossing the slotline extending the Vivaldi antenna into two different coupling zones, as shown in FIG. 3. A slot antenna, such as what is shown in FIG. 3, was described in the patent application published under no. WO 06/108567. To obtain proper isolation between the two input/output ports P'1 and P'2 and normalized impedance at the coupling zones to allow the Vivaldi antenna to operate on two bands, specific dimensions between the microstrip lines 12, 13 and the coupling zone must be respected, as described in the application mentioned above.

The solutions described above have a certain number of disadvantages. Solution B, which involves cascading a conventional microstrip-to-slotline transition, as described with reference to FIG. 2, with a diplexer, causes an increase in insertion losses, namely insertion losses due to the Knorr transition and insertion losses due to junctions shared with the diplexer.

With regard to solution C, it is complicated to implement because it is based on the use of multiple quarter-wave and half-wave lines, which leads to limitations in frequency bandwidth and distance between bands.

SUMMARY OF THE INVENTION

Thus, this invention notably has the purpose of proposing a microstrip-to-slotline transition circuit operating on two frequency bands that allows a broadband antenna to operate on two distinct frequency bands in a simple structure that limits insertion losses as much as possible.

Another purpose of the invention is to propose a microstrip-to-slotline transition circuit that can be achieved in a low-cost technology.

Thus, the invention relates to a microstrip-to-slotline transition circuit operating on two frequency bands, said circuit comprising:
- a substrate equipped with a ground plane,
- a microstrip line on said substrate at a determined distance from the ground plane between a first and second input/output port,
- a slotline in the ground plane crossing said microstrip line in a zone called a transition circuit coupling zone,
- said microstrip line comprising a first portion of microstrip line to transmit a signal from a first frequency band between the first input/output port and the coupling zone and a second portion of microstrip line to transmit a signal from a second frequency band between the second input/output port and the coupling zone,
- said slotline comprising a first portion of slotline to transmit said signal between the coupling zone and a third input/output port and a second portion of slotline extending the slotline beyond the coupling zone, characterised in that a first filtering circuit is connected between the first portion of microstrip line and the first input/output port, said first filtering circuit and said first portion of microstrip line being adapted to accept the frequencies of the first frequency band and reject the frequencies of the second frequency band, and characterised in that a second filtering circuit is connected between the second portion of microstrip line and the second input/output port, said second filtering circuit and said second portion of microstrip line being adapted to accept the frequencies of the second frequency band and reject the frequencies of the first frequency band, the second portion of slotline providing an impedance that is substantially equal to the impedance of an open circuit in the coupling zone in a frequency band covering the first and second frequency bands.

According to one embodiment of this invention, the first filtering circuit and the first portion of microstrip line are adapted to provide the microstrip line in the coupling zone an impedance that is substantially equal to the impedance provided by the second portion of slotline in the first frequency band and an impedance that is substantially equal to a short-circuit impedance for the second frequency band, and the second filtering circuit and the second portion of microstrip line are adapted to provide the microstrip line in the coupling zone an impedance that is substantially equal to the impedance provided by the second portion of slotline in the second frequency band and an impedance that is substantially equal to a short-circuit impedance for the first frequency band.

Preferably, the first filtering circuit is a low pass filter, and the second filtering circuit is a high pass filter, or vice versa.

According to another embodiment, the first and second filtering circuits are band-pass filters or band-stop filters whose cut-off frequencies correspond respectively to the first and second frequency bands. The first and second frequency bands correspond respectively to the frequency band of around 2.4 GHz and the frequency band of around 5 GHz, to be usable in multi-standard multi-mode terminals adapted to the IEEE 802.11a/b/g/n standard.

BRIEF DESCRIPTION OF THE DRAWINGS

Other characteristics and advantages of the invention will appear upon reading the description of different embodiments, this description being realized with reference to the enclosed drawings, wherein.

DETAILED DESCRIPTION OF THE INVENTION

Figure 4:
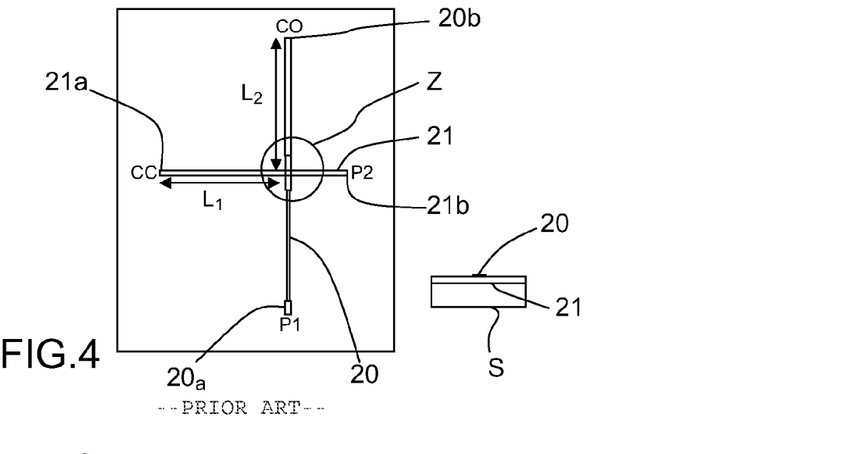
FIG. 4 schematically shows a plan view and a cross sectional view of a microstrip-to-slotline transition according to the Knorr principle.
Figure 5:
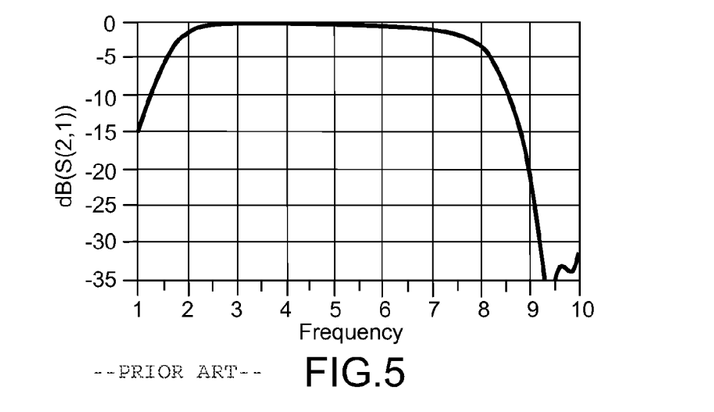
FIG. 5 is a chart illustrating the simulated transmission response S (2.1) of the circuit in FIG. 4.

A description will first be given, with reference to FIGS. 4 and 5, of a traditional Knorr type microstrip-to-slotline transition circuit. Referring to FIG. 4, the transition circuit is achieved on a substrate S equipped with a ground plane. It includes a microstrip line 20 and a slotline 21 etched into the ground plane, the microstrip line having a predetermined distance from the ground plane, as can be seen on the cross sectional view in FIG. 4. The microstrip line 20 terminates at a first end 20a by an input/output port P1 and at a second end 20b by an open circuit OC. The slotline 21 terminates at a first end 21a by a short circuit CC and at a second end 20b by an input/output port P2. Port P1 is connected to a transmission system, and port P2 is connected to a slot antenna. As shown in FIG. 4, the microstrip line 1 extends substantially perpendicular to the slotline 2, and the two lines cross in an area called a coupling zone Z of the transition circuit. Said coupling zone is therefore comprised by the portion of microstrip line covering the portion of slotline at the crossing of the two lines. Therefore, the transfer of energy from port P1 to port P2 is carried out by the electromagnetic coupling of said portions of microstrip line and slotline located in the coupling zone.

To obtain the optimal electromagnetic coupling conditions between the microstrip line 20 and the slotline 21, the portion L2 of microstrip line between the coupling zone and the end 20b of the microstrip line must provide a short circuit in the transition zone Z while the portion L1 of slotline between the end 21a and the coupling zone should provide an open circuit in the transition zone Z. For this purpose, the length of the portion L2 must be substantially equal to $\lambda m/4$, where $\lambda m$ is the guided wavelength in the microstrip line associated with the operating frequency of the transition circuit, while the length of L1 must be substantially equal to $\lambda f/4$, where $\lambda f$ is the guided wavelength in the slotline associated with the operating frequency of the transition circuit. Finally, the line portions between ports P1 or P2 and the transition zones have the function of providing ports P1 and P2, respectively, an impedance close to that of ports P1 and P2, namely generally an impedance of 50 ohms for port P1 and about 80-100 ohms for port P2.

The transition circuit as shown in FIG. 4 was simulated using as a substrate a substrate whose base materials FR4 have a thickness of 1.4 mm. This type of transmission was simulated to operate in a WiFi band of around 5 GHz. The results obtained in FIG. 5, which shows the transmission response from the transition in FIG. 4, shows a very broad bandwidth of about 6 GHz.

Figure 6:
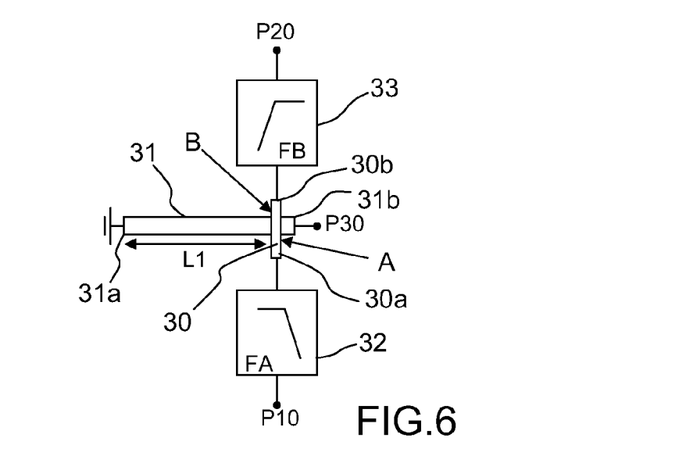
FIG. 6 is a schematic view of an embodiment of the microstrip-to-slotline transition circuit in accordance with the present invention.

In FIG. 6, a diagram is shown of a dual-band microstrip-to-slotline transition circuit according to one embodiment of this invention. In accordance with this invention, the microstrip-to-slotline transition circuit operating in two frequency bands comprises a microstrip line of which each end is connected at the transition plane to a filtering circuit, each filtering circuit accepting a frequency band but rejecting the frequency band of the other filter, all while meeting the coupling conditions according to the Knorr principle. Thus, as shown in FIG. 6, a microstrip line 30 is shown with a first end 30b and a second end 30a, this line being achieved on a substrate equipped with a ground plane, as in the case of the transition shown in FIG. 4. The microstrip line is located at a determined distance from a slotline 31 realized in the ground plane of the substrate. The slotline 31 has a short-circuit end 31a and another end 31b connected to an input/output port P30 to feed a slot antenna such as a Vivaldi antenna, which is not shown. The coupling between the microstrip line 30 and the slotline 31 is realized in the coupling zone in the manner described with reference to FIG. 4. As shown in FIG. 6, the end 30a of the microstrip line is connected by means of a first filter 32 to an input/output port P10, while the other end 30b of the microstrip line 30 is connected through a second filter 33 to a second input/output port P20. As shown in FIG. 6, the filter 32 is a filter with a low-pass response, while the filter 33 is a filter with a high-pass response. The two filters 32 and 33 actually form a diplexer. On the other hand, the short-circuit end 31a of the slotline is located at a distance L'1 from the coupling zone between the slotline and the microstrip line. Thus, the structure shown in FIG. 6 forms a diplexer whose junction line directly feeds a tapered slot or Vivaldi type slot antenna through a microstrip-to-slotline transition. However, for this transition to perfectly meet the conditions of a Knorr type coupling, in order to obtain the lowest possible insertion losses when signals are transmitted at the same time from one port to the other port, namely from port P10 to port P30 or from port P20 to port P30, the following conditions must be met:

Filter 32 must have at junction A a short circuit in the bandwidth of filter 33.

Inversely, filter 33 must have at junction B a short circuit in the bandwidth of filter 32.

Finally, the short-circuit slotline must have an open circuit at the junction in a frequency band that covers both frequency bands of the filters.

This is obtained by adjusting the length L'1 of the slotline so that it is equivalent to the length $\lambda f/4$ at the central frequency of the entire frequency band.

Multiple simulations have been carried out using the Agilent/ADS simulation software.

Figure 7:
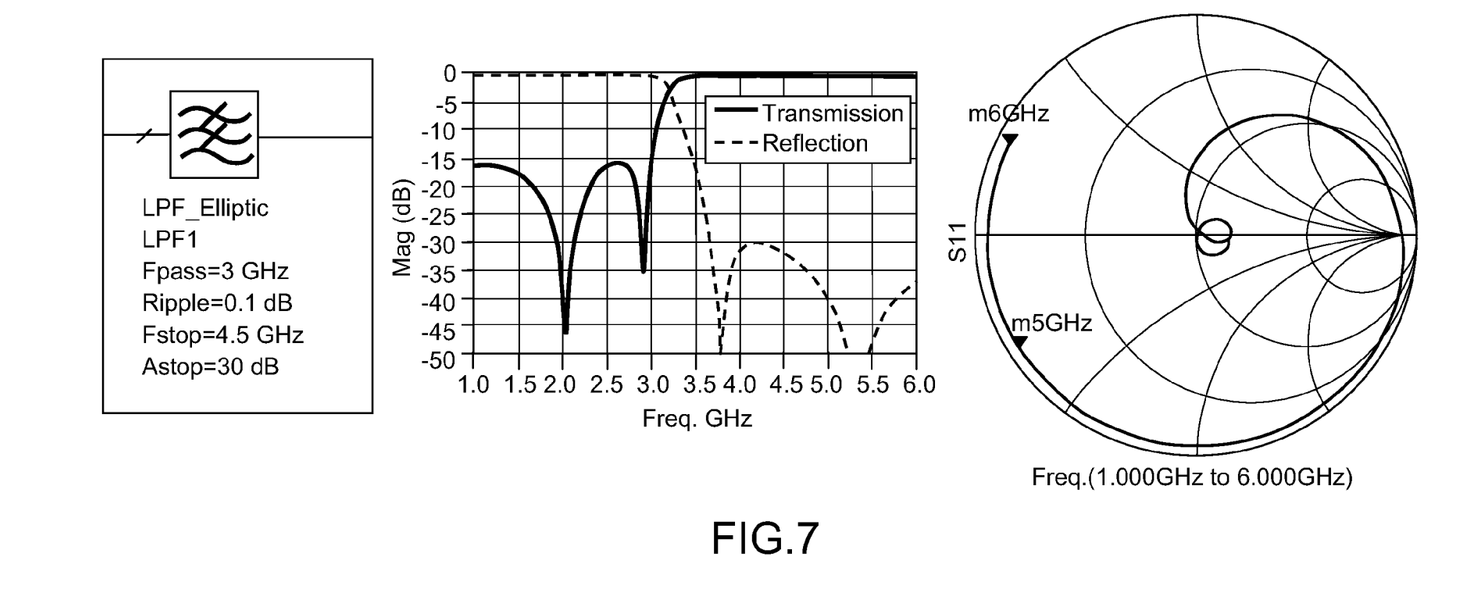
FIG. 7 is a schematic view of a low pass filter and charts illustrating the simulated transmission and return responses of said filter and its Smith chart.

Thus, in FIG. 7, a low-pass filter is shown, namely a low-pass elliptical filter according to the ADS model, which accepts the 2.4 GHz frequency band but rejects the 5 GHz frequency band of more than 30 dB. During the simulation, a transmission line was added, and its length was adjusted in order to obtain the short circuit required in the 5 GHz band. The result is given on the Smith chart shown on the right in FIG. 7. The diagram in the middle shows, based on the frequency, the transmission and reflection curves demonstrating the low-pass operation of the elliptical filter.

Figure 8:
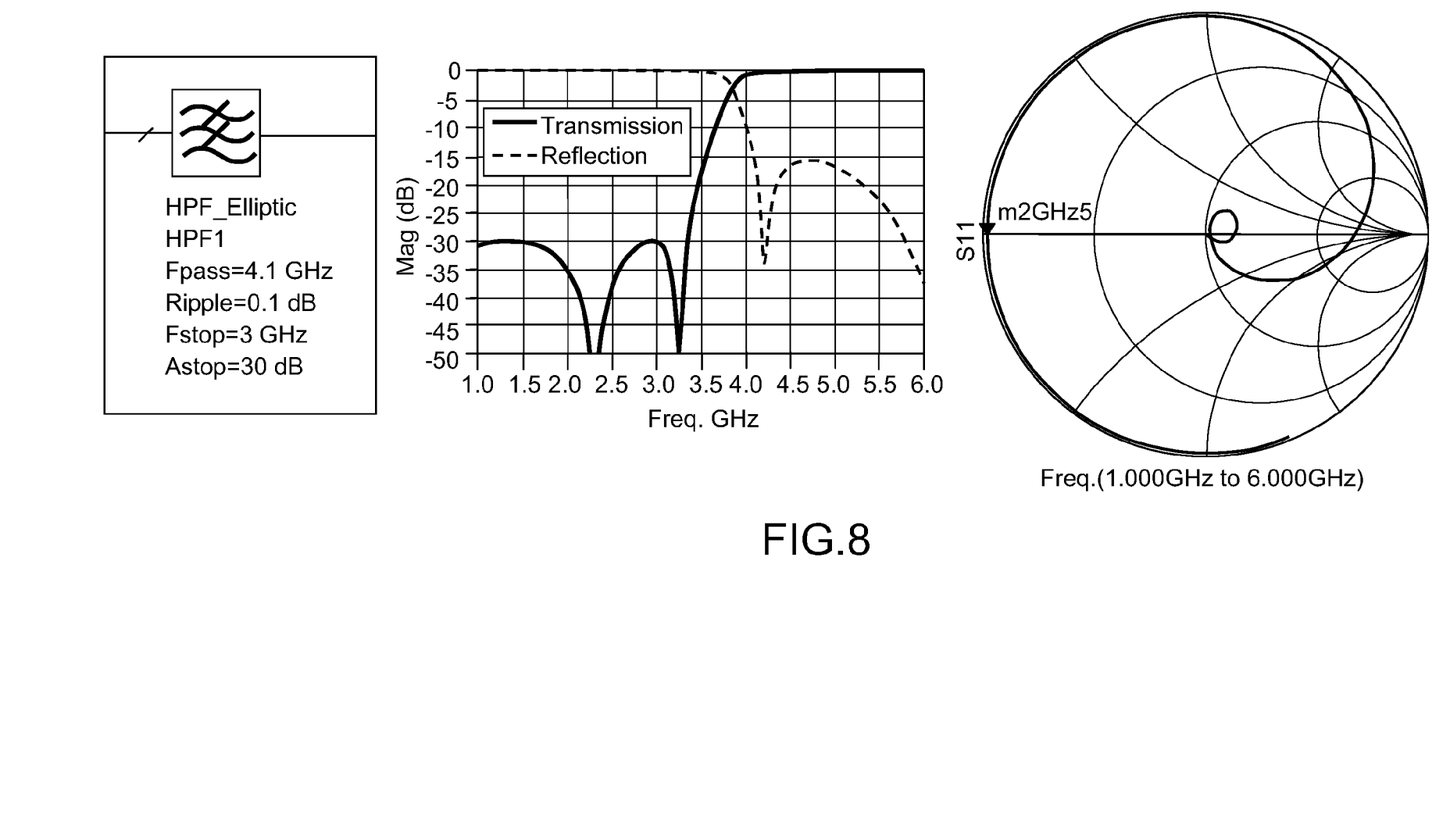
FIG. 8 is a schematic view of a high pass filter and charts illustrating the simulated transmission and return responses of the filter and its Smith chart.

In FIG. 8, a high-pass elliptical filter is shown, according to the ADS model, which accepts the 5 GHz frequency band but rejects the 2.4 GHz frequency band of more than 30 dB. In this case, as before, the response from the Smith chart shows that the filter is short circuited in the 2.4 GHz band, and the diagram in the middle provides, based on the frequency, the transmission curve and the reflection curve demonstrating the operation of the high-pass filter.

Figure 9:
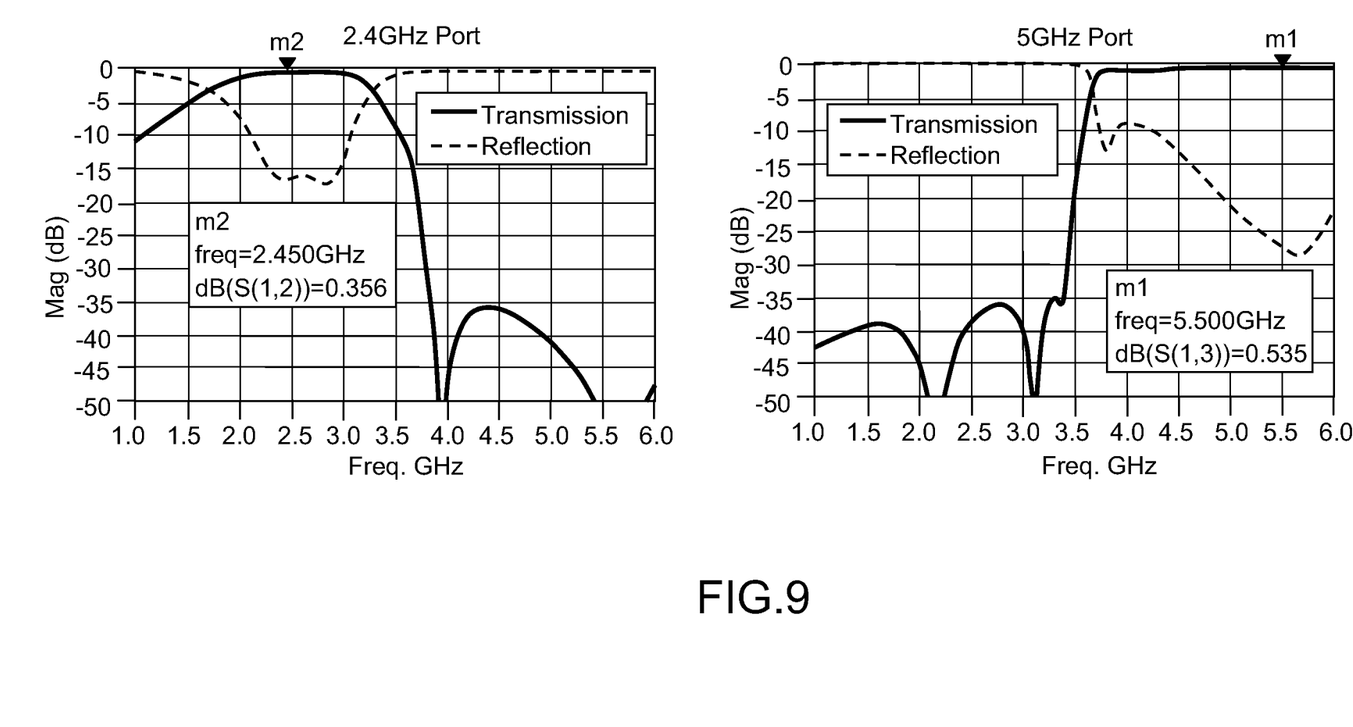
FIG. 9 shows charts illustrating the simulated transmission and return responses of the circuit in FIG. 6.

Simulations have also been carried out on the microstrip-to-slotline transition circuit, as shown in FIG. 7. In this case, the length L1 of the short-circuit slotline is $\lambda f/4$, where $\lambda f$ is the wavelength at a frequency of about 4.5 GHz. The impedance at the input/output port P30, which is the feed port of the slot antenna, is 90 ohms, while the impedances at the input/output ports P10 and P20 are 50 ohms. In FIG. 9, the simulated responses from the microstrip-to-slotline transition are shown, including the following two paths, namely the path going from the input/output port P10 to the input/output port P30 and the path going from the input/output port P20 to the input/output port P30. Note that the insertion losses in each of the bandwidths are remarkably low and that the impedance at each input port matches the given impedance, with low reflection losses of less than 15 dB in both WiFi bands, namely the 2.4 GHz band and the 5 GHz band. Additional, each complementary band has an attenuation of at least 40 dB.

According to another embodiment, the low-pass filters and high-pass filters can be replaced by band-pass or band-stop filters whose cut-off frequencies correspond respectively to the first and second frequency bands.

Thus, the microstrip-to-slotline transition circuit operating in two distinct frequency bands has a certain number of advantages. This transition circuit is easy and simple to realize. It is more compact, the resulting size depending mainly on the size of the filters. The constraints due to the characteristics of the two frequency bands in terms of bandwidth and isolation are low. The limitations mainly come from the Knorr type transition bandwidth. The insertion losses are very low, due to the direct feeding of the antenna from the common junction point of the diplexer.

The invention claimed is:

1. A microstrip-to-slotline transition circuit operating on two frequency bands, said circuit comprising:
a substrate equipped with a ground plane,
a microstrip line on said substrate at a determined distance from the ground plane between a first and second input/output port,
a slotline in the ground plane crossing said microstrip line in a zone called a transition circuit coupling zone,
said microstrip line comprising a first portion of microstrip line to transmit a signal from a first frequency band between the first input/output port and the coupling zone and a second portion of microstrip line to transmit a signal from a second frequency band between the second input/output port and the coupling zone,
said slotline comprising a first portion of slotline to transmit said signal between the coupling zone and a third input/output port and a second portion of slotline extending the slotline beyond the coupling zone,
wherein a first filtering circuit is connected between the first portion of microstrip line and the first input/output port, said first filtering circuit and said first portion of microstrip line being adapted to accept the frequencies of the first frequency band and reject the frequencies of the second frequency band, and wherein a second filtering circuit is connected between the second portion of microstrip line and the second input/output port, said second filtering circuit and said second portion of microstrip line being adapted to accept frequencies of the second frequency band and reject the frequencies of the first frequency band,
the second portion of slotline providing an impedance that is substantially equal to the impedance of an open circuit in the coupling zone in a frequency band covering the first and second frequency bands.

2. A circuit according to claim 1, wherein the first filtering circuit and the first portion of microstrip line are adapted to provide, on the microstrip line in the coupling zone, an impedance that is substantially equal to the impedance provided by the second portion of slotline for the first frequency band and an impedance that is substantially equal to a short-circuit impedance for the second frequency band.

3. A circuit according to claim 1, wherein the second filtering circuit and the second portion of microstrip line are adapted to provide, on the microstrip line in the coupling zone, an impedance that is substantially equal to the impedance provided by the second portion of slotline for the second frequency band and an impedance that is substantially equal to a short-circuit impedance for the first frequency band.

4. A circuit according to claim 1, wherein the first filtering circuit is a low-pass filter and the second filtering circuit is a high-pass filter.

5. A circuit according to claim 1, wherein the first filtering circuit is a high-pass filter and the second filtering circuit is a low-pass filter.

6. A circuit according to claim 1, wherein the first and second filtering circuits are band-pass filters or band-stop filters whose cut-off frequencies correspond respectively to the first and second frequency bands.

7. A circuit according to claim 1, wherein the first and second frequency bands correspond respectively to the frequency band of around 2.4 GHz and the frequency band of around 5 GHz.

8. A wireless communication system comprising microstrip-to-slotline transition circuit operating on two frequency bands, said circuit comprising:
- a substrate equipped with a ground plane,
- a microstrip line on said substrate at a determined distance from the ground plane between a first and second input/output port,
- a slotline in the ground plane crossing said microstrip line in a zone called a transition circuit coupling zone,
- said microstrip line comprising a first portion of microstrip line to transmit a signal from a first frequency band between the first input/output port and the coupling zone and a second portion of microstrip line to transmit a signal from a second frequency band between the second input/output port and the coupling zone,
- said slotline comprising a first portion of slotline to transmit said signal between the coupling zone and a third input/output port and a second portion of slotline extending the slotline beyond the coupling zone,
- wherein a first filtering circuit is connected between the first portion of microstrip line and the first input/output port, said first filtering circuit and said first portion of microstrip line being adapted to accept the frequencies of the first frequency band and reject the frequencies of the second frequency band, and wherein a second filtering circuit is connected between the second portion of microstrip line and the second input/output port, said second filtering circuit and said second portion of microstrip line being adapted to accept frequencies of the second frequency band and reject the frequencies of the first frequency band, the second portion of slotline providing an impedance that is substantially equal to the impedance of an open circuit in the coupling zone in a frequency band covering the first and second frequency bands.

* * * * *